(12) United States Patent
Man

(10) Patent No.: US 10,475,507 B1
(45) Date of Patent: Nov. 12, 2019

(54) SINGLE-ENDED READING CIRCUIT

(71) Applicant: Shanghai Zhaoxin Semiconductor Co., Ltd., Shanghai (CN)

(72) Inventor: Liang Man, Shanghai (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 16/127,890

(22) Filed: Sep. 11, 2018

(30) Foreign Application Priority Data

Apr. 28, 2018 (CN) .......................... 2018 1 0397959

(51) Int. Cl.
| | | |
|---|---|---|
| *G11C 11/419* | (2006.01) | |
| *G11C 7/12* | (2006.01) | |
| *G11C 11/413* | (2006.01) | |
| *G11C 8/08* | (2006.01) | |
| G11C 7/22 | (2006.01) | |
| G11C 7/10 | (2006.01) | |

(52) U.S. Cl.
CPC .............. *G11C 11/419* (2013.01); *G11C 7/12* (2013.01); *G11C 8/08* (2013.01); *G11C 7/106* (2013.01); *G11C 7/1051* (2013.01); *G11C 7/22* (2013.01)

(58) Field of Classification Search
CPC ..... G11C 11/419; G11C 7/067; G11C 7/1048; G11C 7/1051; G11C 11/4091; G11C 7/065; G11C 7/06
USPC ............... 365/189.11, 203, 207, 205, 189.15
See application file for complete search history.

(56) References Cited

U.S. PATENT DOCUMENTS

| | | | | |
|---|---|---|---|---|
| 5,521,874 A | * | 5/1996 | Sandhu | G11C 7/062 365/189.11 |
| 7,859,929 B1 | * | 12/2010 | Roy | G11C 11/39 365/189.09 |
| 8,027,214 B2 | * | 9/2011 | Lin | G11C 11/412 365/154 |
| 8,971,140 B2 | * | 3/2015 | Yoshida | G11C 7/02 365/189.11 |
| 9,177,635 B1 | | 11/2015 | Evans et al. | |
| 9,576,622 B2 | | 2/2017 | Tao et al. | |
| 2010/0124089 A1 | * | 5/2010 | Ali | G11C 7/02 365/49.1 |

FOREIGN PATENT DOCUMENTS

TW         201533743 A        9/2015

* cited by examiner

*Primary Examiner* — Ly D Pham
(74) *Attorney, Agent, or Firm* — McClure, Qualey & Rodack, LLP

(57) ABSTRACT

A single-ended reading circuit includes a pre-charger, a high-level maintainer, a first NAND gate, a second NAND gate, a third NAND gate, and an output driver. The first NAND gate has a first input terminal for receiving a pre-charging clock, a second input terminal coupled to a first node, and an output terminal coupled to a second node. The second NAND gate has a first input terminal coupled through a third node to the second node, a second input terminal coupled to a fourth node, and an output terminal coupled to a fifth node. The third NAND gate has a first input terminal coupled to the fifth node, a second input terminal coupled to the first node, and an output terminal coupled to the fourth node.

13 Claims, 5 Drawing Sheets

SINGLE-ENDED READING CIRCUIT

CROSS REFERENCE TO RELATED APPLICATIONS

This Application claims priority of China Patent Application No. 201810397959.1 filed on Apr. 28, 2018, the entirety of which is incorporated by reference herein.

BACKGROUND OF THE INVENTION

Field of the Invention

The disclosure generally relates to a single-ended reading circuit, and more specifically, to a single-ended reading circuit with low power-consumption, high speed, and high reliability.

Description of the Related Art

SRAM (Static Random Access Memory) is one type of random access memory. The term "static" means that such memory can keep stored data only if it is powered on. A conventional single-ended reading circuit applicable to SRAM usually operates using both a pre-charging clock and a reading clock. However, the design of conventional single-ended reading circuits tends to have the disadvantages of high power-consumption, many output glitches, and low reliability. Accordingly, there is a need to propose a novel solution for solving the problems of the prior art.

BRIEF SUMMARY OF THE INVENTION

In a preferred embodiment, the invention is directed to a single-ended reading circuit including a pre-charger, a high-level maintainer, a first NAND gate, a second NAND gate, a third NAND gate, and an output driver. The pre-charger and the high-level maintainer are coupled to a bit-line node. The pre-charger and the high-level maintainer are configured to selectively pull up a bit-line voltage at the bit-line node. The first NAND gate has a first input terminal for receiving a pre-charging clock, a second input terminal coupled to a first node, and an output terminal coupled to a second node. The second NAND gate has a first input terminal coupled through a third node to the second node, a second input terminal coupled to a fourth node, and an output terminal coupled to a fifth node. The third NAND gate has a first input terminal coupled to the fifth node, a second input terminal coupled to the first node, and an output terminal coupled to the fourth node. The output driver is coupled to the fourth node, and it generates an output voltage at an output node.

In some embodiments, the pre-charger includes a first P-type transistor. The first P-type transistor has a control terminal for receiving the pre-charging clock, a first terminal coupled to a supply voltage, and a second terminal coupled to the bit-line node.

In some embodiments, the high-level maintainer includes a second P-type transistor, a third P-type transistor, a fourth P-type transistor, and a fifth P-type transistor. The second P-type transistor has a control terminal coupled to a ground voltage, a first terminal coupled to a supply voltage, and a second terminal coupled to a sixth node. The third P-type transistor has a control terminal coupled to the ground voltage, a first terminal coupled to the sixth node, and a second terminal coupled to a seventh node. The fourth P-type transistor has a control terminal coupled to the ground voltage, a first terminal coupled to the seventh node, and a second terminal coupled to an eighth node. The fifth P-type transistor has a control terminal coupled to the fourth node, a first terminal coupled to the eighth node, and a second terminal coupled to the bit-line node.

In some embodiments, the output driver includes an inverter. The inverter has an input terminal coupled to the fourth node, and an output terminal coupled to the output node.

In some embodiments, the first node is directly electrically connected to the bit-line node.

In some embodiments, the third node is directly electrically connected to the second node.

In some embodiments, the output pulling-up capability of the first NAND gate is stronger than the output pulling-down capability of the first NAND gate.

In some embodiments, the output pulling-up capability of the second NAND gate is weaker than the output pulling-down capability of the second NAND gate.

In some embodiments, the output pulling-up capability of the third NAND gate is stronger than the output pulling-down capability of the third NAND gate.

In some embodiments, the output pulling-up capability of the third NAND gate is stronger than the output pulling-up capability of the first NAND gate.

In some embodiments, the single-ended reading circuit further includes an N-type transistor. The N-type transistor has a control terminal for receiving a control clock, a first terminal coupled to the first node, and a second terminal coupled to the bit-line node.

In some embodiments, the control clock and the pre-charging clock are in-phase.

In some embodiments, the single-ended reading circuit further includes a sixth P-type transistor. The sixth P-type transistor has a control terminal for receiving the pre-charging clock, a first terminal coupled to a supply voltage, and a second terminal coupled to the first node.

In some embodiments, the single-ended reading circuit further includes an even number of inverters coupled in series between the second node and the third node.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
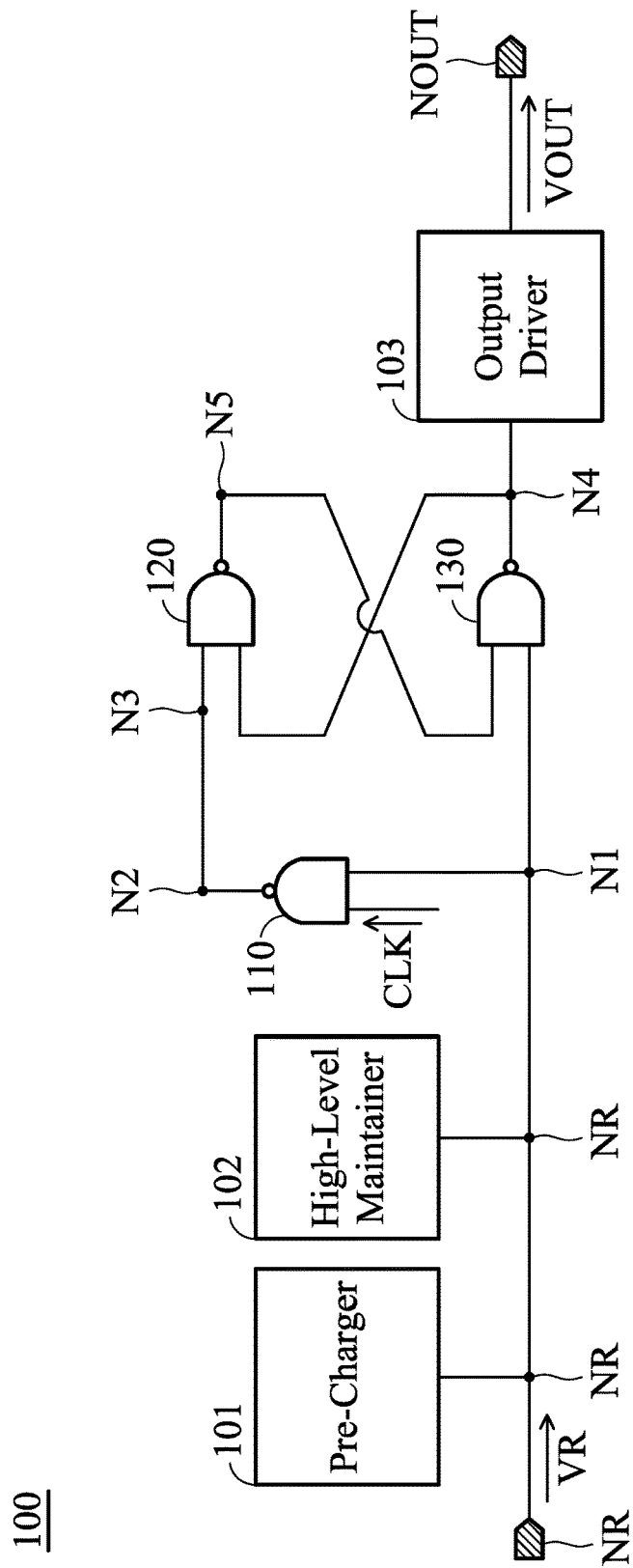
FIG. 1 is a diagram of a single-ended reading circuit according to an embodiment of the invention.

FIG. 1 is a diagram of a single-ended reading circuit 100 according to an embodiment of the invention. The single-ended reading circuit 100 is applicable to SRAM (Static Random Access Memory). As shown in FIG. 1, the single-ended reading circuit 100 includes a pre-charger 101, a high-level maintainer 102, a first NAND gate 110, a second NAND gate 120, a third NAND gate 130, and an output driver 103. The single-ended reading circuit 100 can perform a reading operation according to a pre-charging clock CLK, and its detailed operation will be introduced in the following embodiments.

The first NAND gate 110 has a first input terminal for receiving the pre-charging clock CLK, a second input terminal coupled to a first node N1, and an output terminal coupled to a second node N2. The second NAND gate 120 has a first input terminal coupled through a third node N3 to the second node N2, a second input terminal coupled to a fourth node N4, and an output terminal coupled to a fifth node N5. The third NAND gate 130 has a first input terminal coupled to the fifth node N5, a second input terminal coupled to the first node N1, and an output terminal coupled to the fourth node N4. An SR-latch is formed by the second NAND gate 120 and the third NAND gate 130. The fourth node N4 and the fifth node N5 are used as the SR-latch's two locking nodes for storing digital data. The SR-latch is also controlled by the first NAND gate 110 according to the pre-charging clock CLK. The pre-charger 101 and the high-level maintainer 102 are both coupled to a bit-line node NR. The pre-charger 101 and the high-level maintainer 102 are configured to selectively pull up a bit-line voltage VR at the bit-line node NR. For example, the pre-charger 101 may determine whether to pull up the bit-line voltage VR according to the pre-charging clock CLK, and the high-level maintainer 102 may determine whether to pull up the bit-line voltage VR according to the voltage V4 at the fourth node N4, but they are not limited thereto. The output driver 103 is coupled to the fourth node N4. The output driver 103 can generate an output voltage VOUT at an output node NOUT according to the voltage V4 at the fourth node N4.

It should be noted that the proposed single-ended reading circuit 100 merely uses the pre-charging clock CLK, but does not use any reading clock (the conventional single-ended reading circuit should use both the pre-charging clock and the reading clock). According to practical measurements, using such a design for the invention helps to reduce the power consumption of the single-ended reading circuit 100 and increase the operation speed and the reliability of the single-ended reading circuit 100. The following embodiments will introduce a variety of different configurations of the single-ended reading circuit 100 in detail. However, the figures and descriptions of these embodiments are merely exemplary, rather than limitations of the invention.

Figure 2:
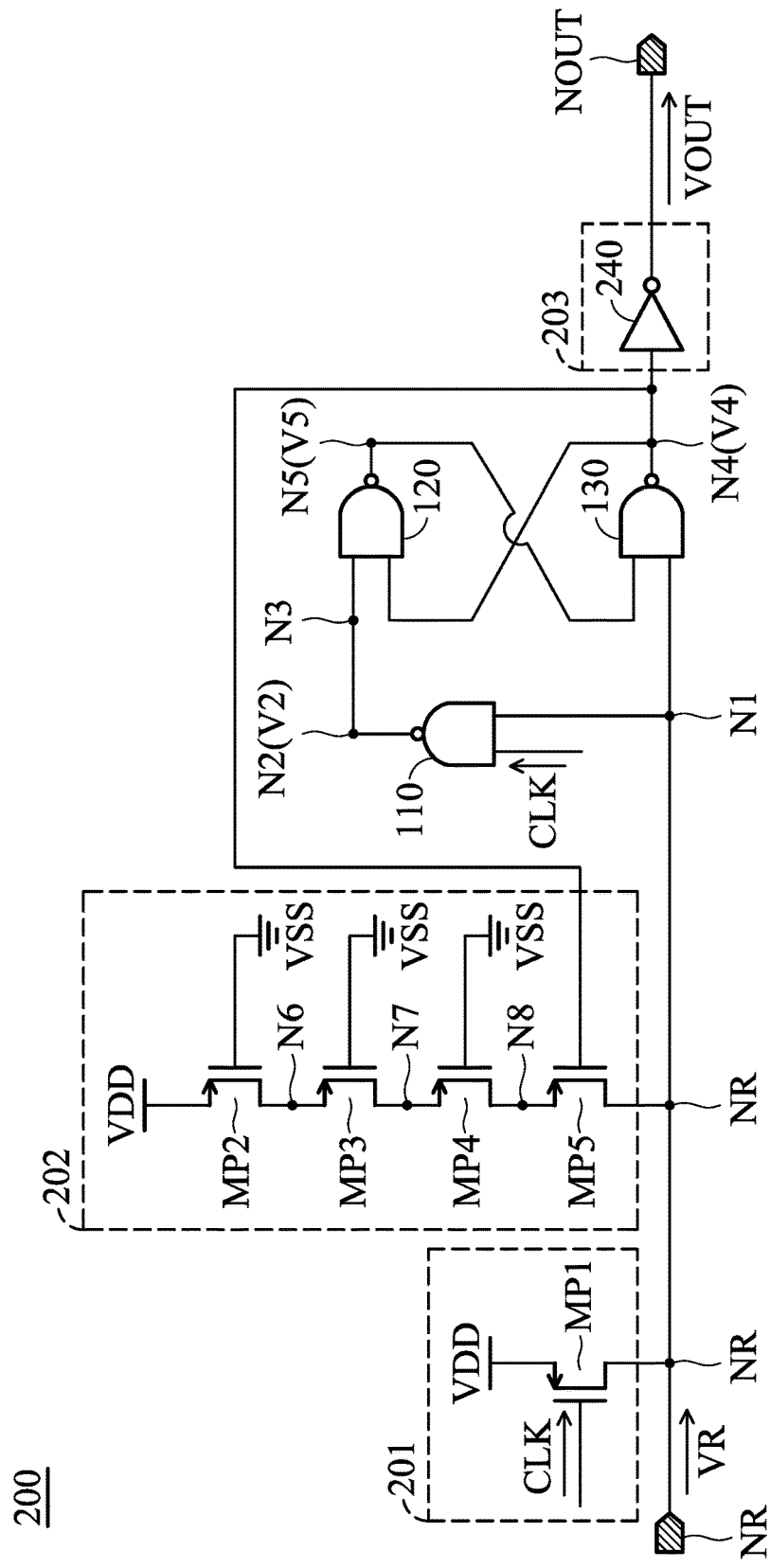
FIG. 2 is a diagram of a single-ended reading circuit according to an embodiment of the invention.

FIG. 2 is a diagram of a single-ended reading circuit 200 according to an embodiment of the invention. As shown in FIG. 2, the single-ended reading circuit 200 includes a pre-charger 201, a high-level maintainer 202, a first NAND gate 110, a second NAND gate 120, a third NAND gate 130, and an output driver 203. The circuit connections and functions of the first NAND gate 110, the second NAND gate 120, and the third NAND gate 130 have been described in the embodiment of FIG. 1. In the embodiment of FIG. 2, the first node N1 is directly electrically connected to the bit-line node NR, and the third node N3 is directly electrically connected to the second node N2. That is, the first node N1 is equivalent to the bit-line node NR, and the third node N3 is equivalent to the second node N2.

The pre-charger 201 includes a first P-type transistor MP1. For example, the first P-type transistor MP1 may be a PMOS transistor (P-type Metal Oxide Semiconductor Field Effect Transistor). The first P-type transistor MP1 has a control terminal for receiving the pre-charging clock CLK, a first terminal coupled to a supply voltage VDD (e.g., 1V), and a second terminal coupled to the bit-line node NR. In some embodiments, if the pre-charging clock CLK has a low logic level (e.g., a logic "0" or a digit "0"), the pre-charger 201 will pull up the bit-line voltage VR at the bit-line node NR; conversely, if the pre-charging clock CLK has a high logic level (e.g., a logic "1" or a digit "1"), the pre-charger 201 will not pull up the bit-line voltage VR at the bit-line node NR.

The high-level maintainer 202 includes a second P-type transistor MP2, a third P-type transistor MP3, a fourth P-type transistor MP4, and a fifth P-type transistor MP5, which may be coupled in series. For example, each of the second P-type transistor MP2, the third P-type transistor MP3, the fourth P-type transistor MP4, and the fifth P-type transistor MP5 may be a respective PMOS transistor. The second P-type transistor MP2 has a control terminal coupled to a ground voltage VSS (e.g., 0V), a first terminal coupled to the supply voltage VDD, and a second terminal coupled to a sixth node N6. The third P-type transistor MP3 has a control terminal coupled to the ground voltage VSS, a first terminal coupled to the sixth node N6, and a second terminal coupled to a seventh node N7. The fourth P-type transistor MP4 has a control terminal coupled to the ground voltage VSS, a first terminal coupled to the seventh node N7, and a second terminal coupled to an eighth node N8. The fifth P-type transistor MP5 has a control terminal coupled to the fourth node N4 for receiving the voltage V4, a first terminal coupled to the eighth node N8, and a second terminal coupled to the bit-line node NR. In some embodiments, if the voltage V4 at the fourth node N4 has a low logic level, the high-level maintainer 202 will pull up the bit-line voltage VR at the bit-line node NR; conversely, if the voltage V4 at the fourth node N4 has a high logic level, the high-level maintainer 202 will not pull up the bit-line voltage VR at the bit-line node NR. Although there are merely four P-type transistors MP2, MP3, MP4 and MP5 displayed in FIG. 2, in other embodiments, the single-ended reading circuit 200 may include two, three, five, six, seven or more P-type transistors coupled in series according to different requirements.

The output driver 203 includes an inverter 240. The inverter 240 has an input terminal coupled to the fourth node N4 for receiving the voltage V4, and an output terminal coupled to the output node NOUT for outputting the output voltage VOUT. In some embodiments, the voltage V4 at the fourth node N4 and the output voltage VOUT have complementary logic levels. Other features of the single-ended reading circuit 200 of FIG. 2 are similar to those of the single-ended reading circuit 100 of FIG. 1. Accordingly, these embodiments can achieve similar levels of performance.

Figure 3:
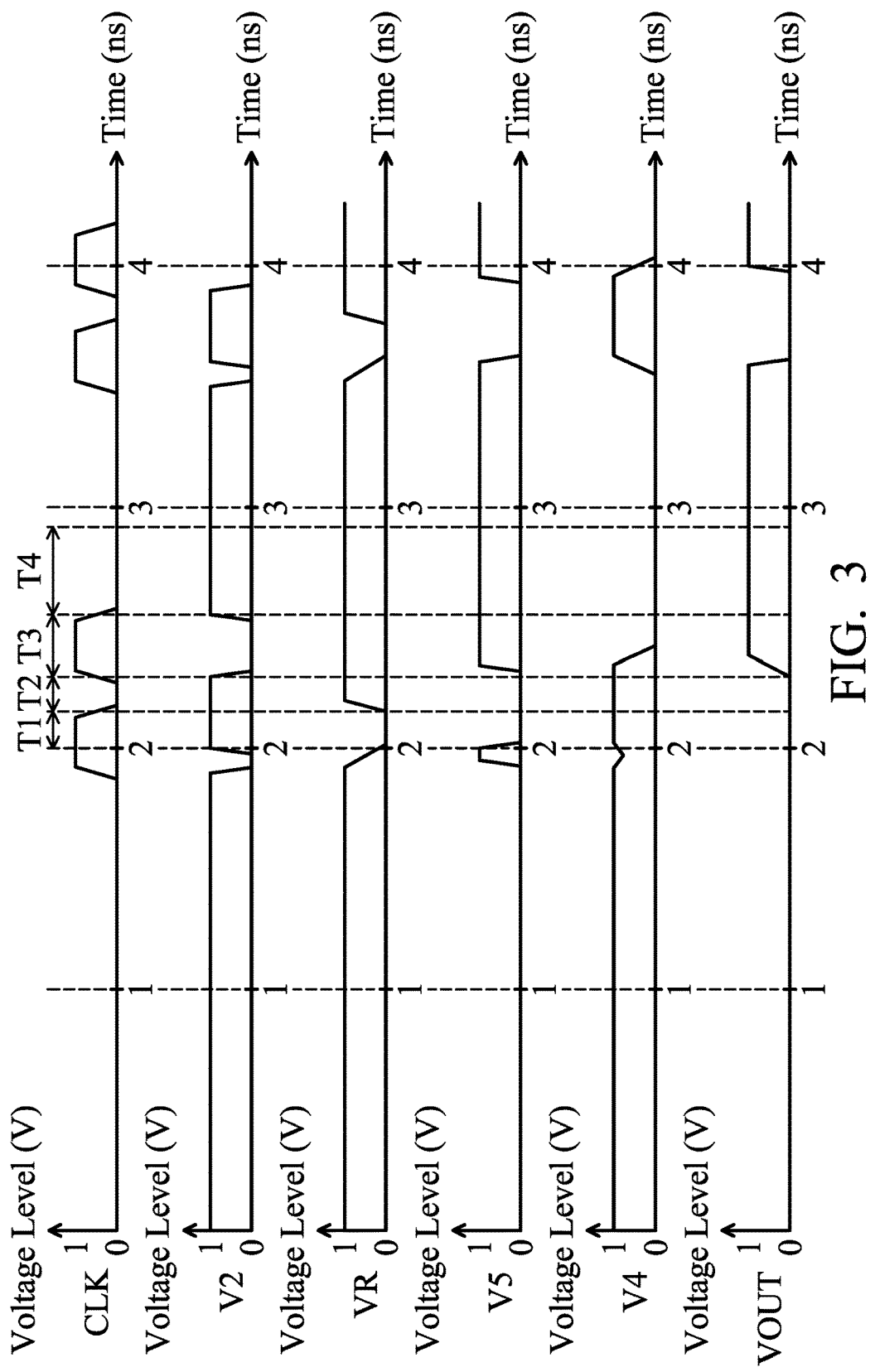
FIG. 3 is a diagram of waveforms of a single-ended reading circuit according to an embodiment of the invention.

FIG. 3 is a diagram of waveforms of the single-ended reading circuit 200 according to an embodiment of the invention. Please refer to FIG. 2 and FIG. 3 together, so as to understand the operation principles of the invention. Generally, when the pre-charging clock CLK has a low logic level, the single-ended reading circuit 200 can perform a pre-charging operation to pull up the bit-line voltage VR and maintain the data stored in the SR-latch, and when the pre-charging clock CLK has a high logic level, the single-ended reading circuit 200 can perform a reading operation to read out digital data corresponding to the bit-line voltage VR. The signal waveforms of FIG. 3 can be divided into a first time interval T1, a second time interval T2, a third time interval T3, and a fourth time interval T4, which will be introduced in detail below.

During the first time interval T1, the pre-charging clock CLK has a high logic level. At this time, the word line of the SRAM is enabled, and a digit "0" is read out from the SRAM. The bit-line voltage VR is discharged to a low logic level. The SR-latch reads out data using the third NAND gate 130. It should be noted the data read result of the SR-latch is not affected, regardless of a high or low logic level of the voltage V5 at the fifth node N5. Within the first time interval T1, the voltage V4 of the fourth node N4 has a high logic level, the output voltage VOUT has a low logic level, the voltage V2 at the second node N2 has a high logic level, and the voltage V5 at the fifth node N5 has a low logic level.

During the second time interval T2, the pre-charging clock CLK has a low logic level. At this time, the bit-line voltage VR and the voltage V2 at the second node N2 are both pre-charged to a high logic level. Within the second time interval T2, the SR-latch can maintain the data, and the voltage V5 at the fifth node N5, the voltage V4 at the fourth node N4, and the output voltage VOUT are unchanged (i.e., the voltage V5 still has a low logic level, the voltage V4 still has a high logic level, and the output voltage VOUT still has a low logic level; they are the same as those within the first time interval T1).

During the third time interval T3, the pre-charging clock CLK has a high logic level. At this time, the word line of the SRAM is enabled, and a digit "1" is read out from the SRAM. The bit-line voltage VR is kept at a high logic level. The SR-latch reads out the data using the first NAND gate 110, the second NAND gate 120, and the third NAND gate 130. Within the third time interval T3, the voltage V2 at the second node N2 is transferred from a high logic level to a low logic level, the voltage V5 at the fifth node N5 is transferred from a low logic level to a high logic level, the voltage V4 at the fourth node N4 is transferred from a high logic level to a low logic level, and the output voltage VOUT is transferred from a low logic level to a high logic level.

During the fourth time interval T4, the pre-charging clock CLK has a low logic level. At this time, the bit-line voltage VR and the voltage V2 at the second node N2 are both pre-charged to a high logic level. Within the fourth time interval T4, the SR-latch can maintain the data, and the voltage V5 at the fifth node N5, the voltage V4 at the fourth node N4, and the output voltage VOUT are unchanged (i.e., the voltage V5 still has a high logic level, the voltage V4 still has a low logic level, and the output voltage VOUT still has a high logic level; they are the same as those within the third time interval T3).

In some embodiments, the output pulling-up capabilities and the output pulling-down capabilities of the first NAND gate 110, the second NAND gate 120, and the third NAND gate 130 are adjustable by appropriately designing their transistor sizes. The so-called "output pulling-up capability" means the NAND gate's driving capability in pulling up its output terminal voltage, and the so-called "output pulling-down capability" means the NAND gate's driving capability in pulling down its output terminal voltage. If the driving capability is stronger, it will take the NAND gate shorter time to pull up or pull down its output terminal voltage. For example, the output pulling-up capability of the first NAND gate 110 may be stronger than the output pulling-down capability of the first NAND gate 110; the output pulling-up capability of the second NAND gate 120 may be weaker than the output pulling-down capability of the second NAND gate 120; the output pulling-up capability of the third NAND gate 130 may be stronger than the output pulling-down capability of the third NAND gate 130; the output pulling-up capability of the third NAND gate 130 may be stronger than the output pulling-up capability of the first NAND gate 110. According to practical measurements, the design of the above transistor sizes helps to eliminate the output glitches of the single-ended reading circuit 200, thereby reducing the whole power consumption.

It should be noted that the single-ended reading circuit 100 (or 200) can operate according to only the pre-charging clock CLK, without using any reading clock. Such a design can reduce the non-ideal difference between the pre-charging clock CLK and the reading clock, thereby enhancing the reliability of the single-ended reading circuit 100 (or 200). In addition, since the reading-in to reading-out operation of the single-ended reading circuit 100 (or 200) uses only two circuit stages, the operation speed of the single-ended reading circuit 100 (or 200) is further improved.

TABLE I

Comparison of Single-ended Reading Circuit's Power consumption Between Conventional Design and the Invention

| Unit: μA | Alternately reading a digit "1" and a digit "0" | Continuously reading two digits "0" |
|---|---|---|
| The Invention | 67.463 | 48.945 |
| Conventional Design | 89.884 | 136.656 |

TABLE II

Comparison of Single-ended Reading Circuit's Operation Speed Between Conventional Design and the Invention

| Unit: ps | Operation Time |
|---|---|
| The Invention | 184 |
| Conventional Design | 202 |

According to the measurements of Table I and Table II, it should be understood that the power consumption of the single-ended reading circuit 100 (or 200) of the invention is reduced by about 50% compared to that of the conventional design, and the operation speed of the single-ended reading circuit 100 (or 200) of the invention is increased by about 10% compared to that of the conventional design. Therefore, the design of the invention can significantly improve a variety of performance indicators of the single-ended reading circuit 100 (or 200).

Figure 4:
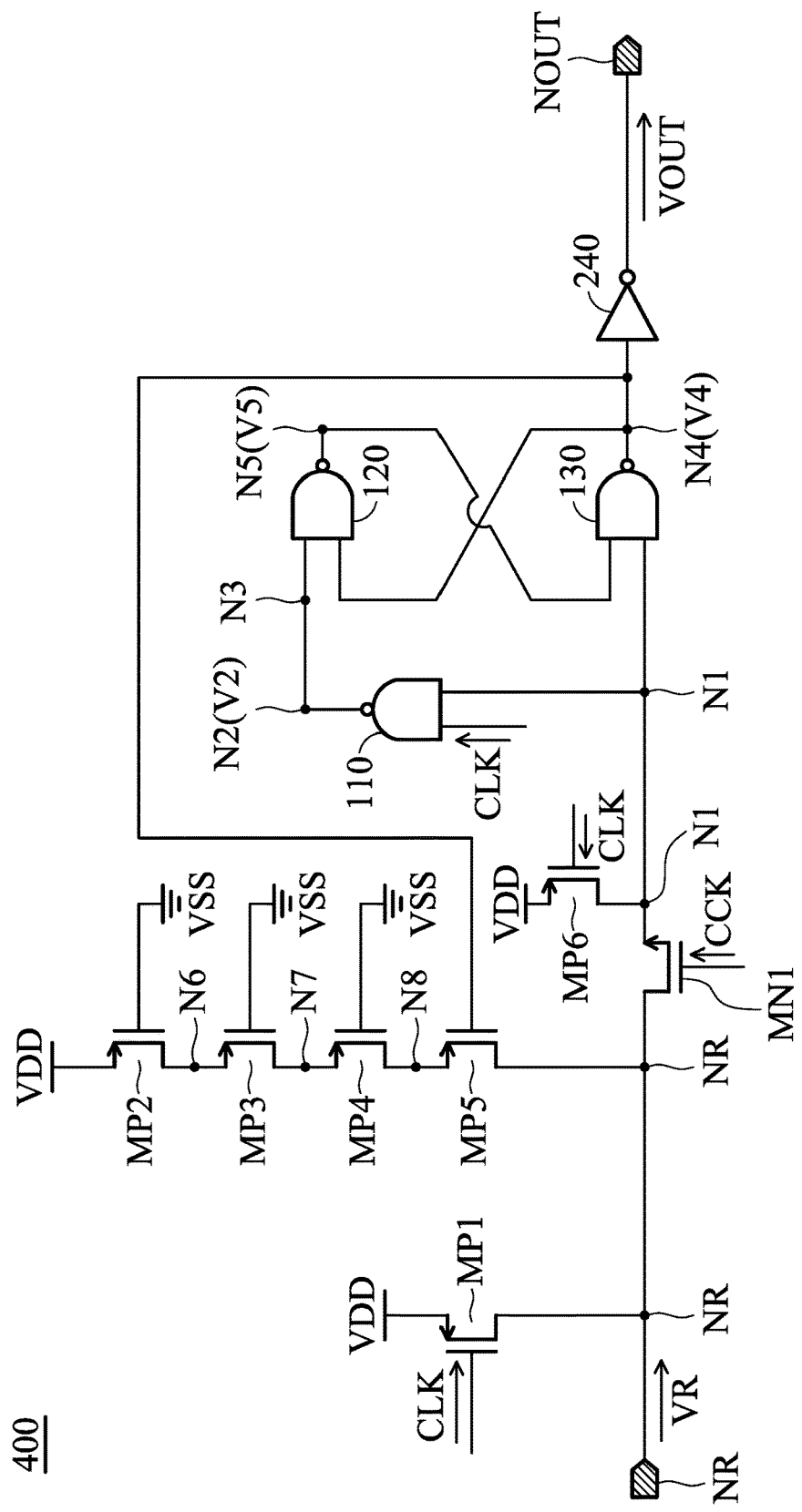
FIG. 4 is a diagram of a single-ended reading circuit according to an embodiment of the invention.

FIG. 4 is a diagram of a single-ended reading circuit 400 according to an embodiment of the invention. FIG. 4 is similar to FIG. 2. In the embodiment of FIG. 4, the single-ended reading circuit 400 further includes an N-type transistor MN1 and a sixth P-type transistor MP6. For example, the N-type transistor MN1 may be an NMOS transistor (N-type Metal Oxide Semiconductor Field Effect Transistor), and the sixth P-type transistor MP6 may be a PMOS transistor. The N-type transistor MN1 has a control terminal for receiving a control clock CCK, a first terminal coupled to the first node N1, and a second terminal coupled to the bit-line node NR. In some embodiments, the control clock CCK and the pre-charging clock CLK are in-phase, and only a small time difference may exist between them. The sixth P-type transistor MP6 has a control terminal for receiving the pre-charging clock CLK, a first terminal coupled to the supply voltage VDD, and a second terminal coupled to the first node N1. The N-type transistor MN1 may be used as a multiplexer, and the sixth P-type transistor MP6 may be used as an additional pre-charger. According to practical measurements, the incorporation of the N-type transistor MN1 and the sixth P-type transistor MP6 helps to further increase the reliability of the single-ended reading circuit 400. Other features of the single-ended reading circuit 400 of FIG. 4 are similar to those of the single-ended reading circuits 100 and 200 of FIGS. 1 and 2. Accordingly, these embodiments can achieve similar levels of performance.

Figure 5:
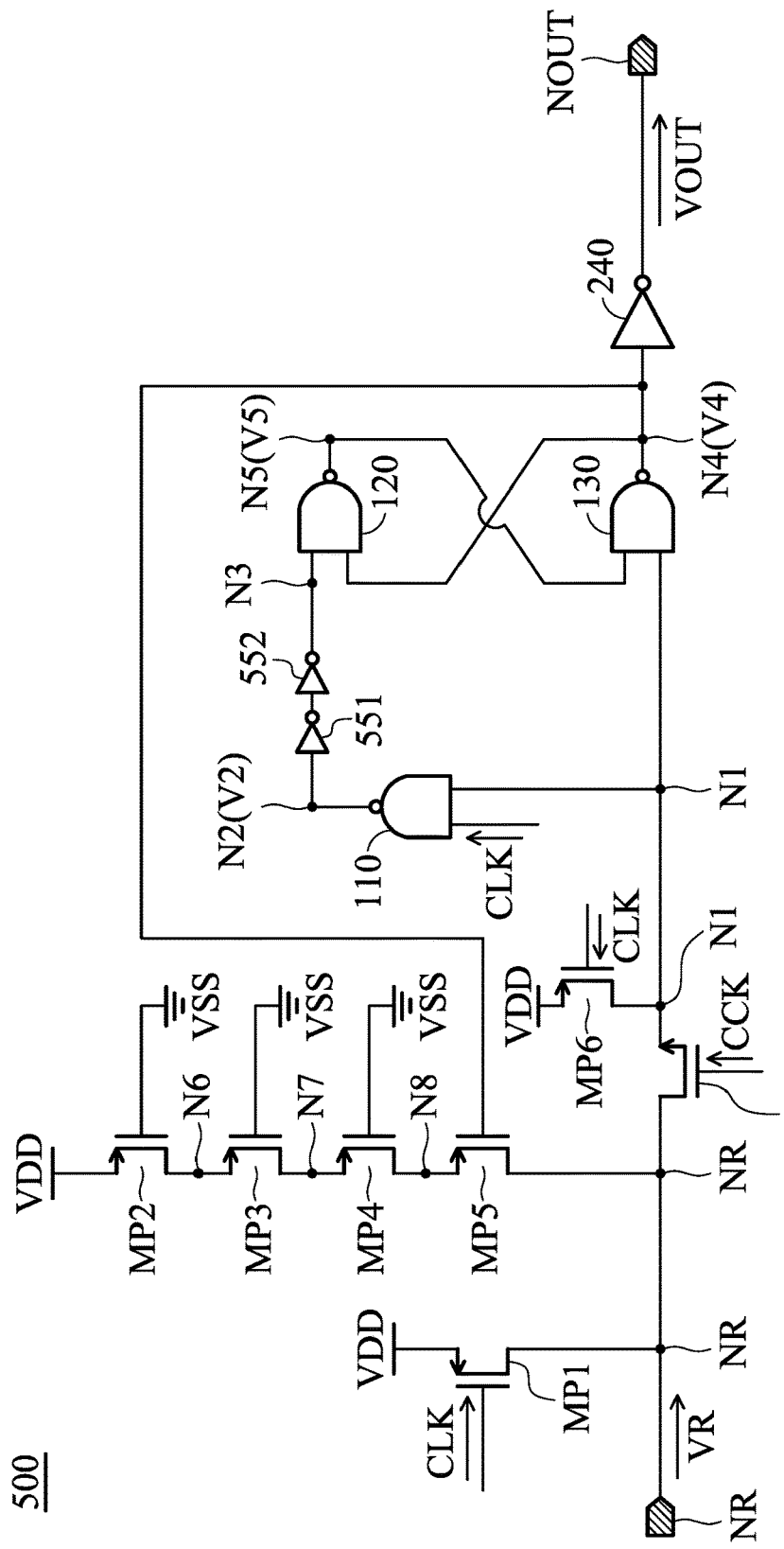
FIG. 5 is a diagram of a single-ended reading circuit according to an embodiment of the invention.

FIG. 5 is a diagram of a single-ended reading circuit 500 according to an embodiment of the invention. FIG. 5 is similar to FIG. 4. In the embodiment of FIG. 5, the single-ended reading circuit 500 further includes an even number of inverters 551 and 552, which are coupled in series between the second node N2 and the third node N3. Specifically, the inverter 551 has an input terminal coupled to the second node N2, and an output terminal; the inverter 552 has an input terminal coupled to the output terminal of the inverter 551, and an output terminal coupled to the third node N3. The aforementioned inverters 551 and 552 are used as a delay unit. Although there are merely two inverters 551 and 552 displayed in FIG. 5, in other embodiments, the single-ended reading circuit 500 may include four, six, eight, or more inverters coupled in series according to different requirements. According to practical measurements, the incorporation of the aforementioned inverters 551 and 552 helps to eliminate the output glitches of the single-ended reading circuit 500 and reduce the power consumption of the single-ended reading circuit 500. Other features of the single-ended reading circuit 500 of FIG. 5 are similar to those of the single-ended reading circuits 100, 200 and 400 of FIGS. 1, 2 and 4. Accordingly, these embodiments can achieve similar levels of performance.

Note that the above voltages, currents, resistances, inductances, capacitances and other element parameters are not limitations of the invention. A designer can adjust these parameters according to different requirements. The single-ended reading circuit of the invention is not limited to the configurations of FIGS. 1-5. The invention may merely include any one or more features of any one or more embodiments of FIGS. 1-5. In other words, not all of the features displayed in the figures should be implemented in the single-ended reading circuit of the invention. Although the embodiments of the invention use MOSFET (Metal Oxide Semiconductor Field Effect Transistor) as examples, the invention is not limited thereto, and those skilled in the art may use other types of transistors such as BJT (Bipolar Junction Transistor), JFET (Junction Gate Field Effect Transistor), FinFET (Fin Field Effect Transistor), etc.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. A single-ended reading circuit, comprising:
    a pre-charger, coupled to a bit-line node;
    a high-level maintainer, coupled to the bit-line node, wherein the pre-charger and the high-level maintainer are configured to selectively pull up a bit-line voltage at the bit-line node;
    a first NAND gate, wherein the first NAND gate has a first input terminal for receiving a pre-charging clock, a second input terminal coupled to a first node, and an output terminal coupled to a second node, wherein the first node is directly electrically connected to the bit-line node;
    a second NAND gate, wherein the second NAND gate has a first input terminal coupled to the second node, a second input terminal coupled to a fourth node, and an output terminal coupled to a fifth node;
    a third NAND gate, wherein the third NAND gate has a first input terminal coupled to the fifth node, a second input terminal coupled to the first node, and an output terminal coupled to the fourth node; and
    an output driver, coupled to the fourth node, and generating an output voltage at an output node.

2. The single-ended reading circuit as claimed in claim 1, wherein the pre-charger comprises:
    a first P-type transistor, wherein the first P-type transistor has a control terminal for receiving the pre-charging clock, a first terminal coupled to a supply voltage, and a second terminal coupled to the bit-line node.

3. The single-ended reading circuit as claimed in claim 1, wherein the high-level maintainer comprises:
    a second P-type transistor, wherein the second P-type transistor has a control terminal coupled to a ground voltage, a first terminal coupled to a supply voltage, and a second terminal coupled to a sixth node;
    a third P-type transistor, wherein the third P-type transistor has a control terminal coupled to the ground voltage, a first terminal coupled to the sixth node, and a second terminal coupled to a seventh node;
    a fourth P-type transistor, wherein the fourth P-type transistor has a control terminal coupled to the ground voltage, a first terminal coupled to the seventh node, and a second terminal coupled to an eighth node; and
    a fifth P-type transistor, wherein the fifth P-type transistor has a control terminal coupled to the fourth node, a first terminal coupled to the eighth node, and a second terminal coupled to the bit-line node.

4. The single-ended reading circuit as claimed in claim 1, wherein the output driver comprises:
    an inverter, wherein the inverter has an input terminal coupled to the fourth node, and an output terminal coupled to the output node.

5. The single-ended reading circuit as claimed in claim 1, wherein the first input terminal of the second NAND gate is directly electrically connected to the second node.

6. The single-ended reading circuit as claimed in claim 1, wherein an output pulling-up capability of the first NAND gate is stronger than an output pulling-down capability of the first NAND gate.

7. The single-ended reading circuit as claimed in claim 1, wherein an output pulling-up capability of the second NAND gate is weaker than an output pulling-down capability of the second NAND gate.

8. The single-ended reading circuit as claimed in claim 1, wherein an output pulling-up capability of the third NAND gate is stronger than an output pulling-down capability of the third NAND gate.

9. The single-ended reading circuit as claimed in claim 1, wherein an output pulling-up capability of the third NAND gate is stronger than an output pulling-up capability of the first NAND gate.

10. The single-ended reading circuit as claimed in claim 1, further comprising:

an N-type transistor, wherein the N-type transistor has a control terminal for receiving a control clock, a first terminal coupled to the first node, and a second terminal coupled to the bit-line node.

11. The single-ended reading circuit as claimed in claim 10, wherein the control clock and the pre-charging clock are in-phase.

12. The single-ended reading circuit as claimed in claim 10, further comprising:

a sixth P-type transistor, wherein the sixth P-type transistor has a control terminal for receiving the pre-charging clock, a first terminal coupled to a supply voltage, and a second terminal coupled to the first node.

13. The single-ended reading circuit as claimed in claim 10, further comprising:

an even number of inverters, coupled in series between the second node and the first input terminal of the second NAND gate.

* * * * *